(12) United States Patent
Tellkamp et al.

(10) Patent No.: US 7,125,789 B2
(45) Date of Patent: Oct. 24, 2006

(54) COMPOSITE METAL COLUMN FOR MOUNTING SEMICONDUCTOR DEVICE

(75) Inventors: John P. Tellkamp, Denison, TX (US); Akira Matsunami, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 226 days.

(21) Appl. No.: 10/732,666

(22) Filed: Dec. 8, 2003

(65) Prior Publication Data

US 2004/0135251 A1 Jul. 15, 2004

Related U.S. Application Data

(60) Provisional application No. 60/437,593, filed on Dec. 31, 2002, provisional application No. 60/437,366, filed on Dec. 31, 2002.

(51) Int. Cl.
*H01L 21/44* (2006.01)
(52) U.S. Cl. .................. 438/614; 438/108; 438/613; 29/843
(58) Field of Classification Search ................ 438/123, 438/614
See application file for complete search history.

(56) References Cited

U.S. PATENT DOCUMENTS 5,130,779 A 7/1992 Agarwala et al. ............. 357/67
6,024,275 A 2/2000 Takiar .................... 228/180.22
6,077,380 A 6/2000 Hayes et al. ................. 156/283
6,249,963 B1 6/2001 Chou et al.
2003/0038162 A1* 2/2003 Chew et al. ........... 228/180.21
2004/0087057 A1* 5/2004 Wang et al. ................ 438/106

FOREIGN PATENT DOCUMENTS

EP 0 704 895 A2 4/1996
WO WO 97/19466 5/1997

\* cited by examiner

*Primary Examiner*—Carl Whitehead, Jr.
*Assistant Examiner*—Colleen E. Rodgers
(74) *Attorney, Agent, or Firm*—Yingsheng Tung; Wade James Brady, III; Frederick J. Telecky, Jr.

(57) ABSTRACT

An integrated circuit chip 903, which has a plurality of pads 903b and non-reflowable contact members 1201 to be connected by reflow attachment to external parts. Each of these contact members 1201 has a height-to-diameter ratio and uniform diameter favorable for absorbing strain under thermo-mechanical stress. The members have a solderable surface 1202 on each end and a layer of reflowable material on each end. Each member is solder-attached (1204) at one end to a chip contact pad 903b, while the other end (1203) of each member is operable for reflow attachment to external parts.

5 Claims, 5 Drawing Sheets

COMPOSITE METAL COLUMN FOR MOUNTING SEMICONDUCTOR DEVICE

This application claims priority under 35 USC 119 (e) (1) of provisional application Nos. 60/437,593 filed Dec. 31, 2002 and 60/437,366 filed Dec. 31, 2002.

FIELD OF THE INVENTION

The present invention is related in general to the field of semiconductor devices and processes and more specifically to the structure and method of interconnection members of integrated circuit chips and packages.

DESCRIPTION OF THE RELATED ART

During and after assembly of an integrated circuit (IC) chip to an external part such as a substrate or circuit board by solder reflow, and then during device operation, significant temperature differences and temperature cycles appear between the semiconductor chip and the substrate. This is especially true of flip-chip type mounting schemes. The reliability of the solder joint is strongly influenced by the coefficients of thermal expansion of the semiconductor material and the substrate material. For example, there is more than one order of magnitude difference between the coefficients of thermal expansion of silicon and FR-4. This difference causes thermomechanical stresses, most of which are absorbed by the solder joints.

Thermomechanical stress difficulties are aggravated by coplanarity problems of the solder balls and the difficulties involved in obtaining a favorable height-to-diameter ratio and uniformity of the solder interconnection. These difficulties start with the solder ball attach process. As an example, when solder paste is dispensed, the volume of solder paste may vary in volume, making it difficult to control the solder ball height. When prefabricated solder balls are used, the difficulty of avoiding a missed attachment site is well known. A coherent, low-cost method is needed to fabricate solder balls of uniform volume and deliver them to the attachment site without missing a site. The method should be flexible enough to be applied for different semiconductor product families and a wide spectrum of design and process variations.

Furthermore, evidence suggests that solder connections of short length and non-uniform width are unfavorable for stress distribution and strain absorption. The stress remains concentrated in the region of the chip-side solder joint, where it may lead to early material fatigue and crack phenomena. Accordingly, solder connections of generally spherical shape are likely to be more sensitive to stress than elongated connections.

The fabrication methods and reliability problems involving flip-chips re-appear, in somewhat modified form, for ball-grid array type packages, including chip-scale packages (CSP). Most CSP approaches are based on flip-chip assembly with solder bumps or solder balls on the exterior of the package, to interface with system or wiring boards.

Following the solder reflow step, flip-assembled chips and packages often use a polymeric underfill between the chip, or package, and the interposer, substrate, or printed circuit board (PCB). These underfill materials alleviate some of the thermomechanical stress caused by the mismatch of the coefficients of thermal expansion (CTE) of package components. But as a process step, underfilling is time-consuming and expensive, and is preferably avoided.

During the last decade, a number of variations in device structure, materials, or process steps have been implemented in manufacturing in order to alleviate the thermomechanical stress problem. All of them suffer from some drawback in cost, fabrication flow, material selection, and so forth.

A need has therefore arisen for a coherent, low-cost method of assembling flip-chip integrated circuit chips and semiconductor devices that provides a high degree of thermomechanical stress reliability. The method should be flexible enough to be applied for different semiconductor product families and a wide spectrum of design and process variations. Preferably, these innovations should be accomplished using the installed equipment base so that no investment in new manufacturing machines is needed.

SUMMARY OF THE INVENTION

One embodiment of the invention comprises a method for forming interconnection elements, such as solder balls, of uniform volume and assembling these elements on the integrated circuit (IC) contact pads of a semiconductor wafer, without missing a contact pad. The thickness of a sheet of solder material determines one dimension of the volume of the interconnection elements.

Further provided is a two-part die for guiding a stamping punch; each part has a structure to match the pattern of the IC pads. The solder sheet is clamped between the die parts. A stamping punch has a plurality of stamping pins; the cross section area of the pins determines the other dimensions of the solder ball volume. The pins are distributed to match the distribution of the circuit pads. The stamping punch, the die with the clamped solder sheet, and the semiconductor wafer are aligned so that each stamp pin is located over one of the circuit pads. The punch is pressed through the die and the sheet so that each pin stamps out a platelet from the sheet, creating one platelet for each pad area. The platelets are brought in surface contact with the pads. Heat is then applied to the individual solder platelets and the wafer to melt the platelets. Finally, the melted solder reflows to form an interconnection element, or solder ball, at each contact pad area.

It is a technical advantage of the method of the invention that all interconnection elements for an IC wafer are created in a batch process, have the same volume, and no contact pads can be missed. The method is low-cost and reliable.

In another embodiment of the invention, the method is applied to batch-process forming of the interconnection elements and assembling the elements on the contact pads of a semiconductor package. It is a technical advantage of the invention that the method can be applied to many families of surface-mount packages such as ball grid array packages, chip-scale packages, and chip-size packages.

Another embodiment of the invention comprises an integrated circuit chip, which has a plurality of pads and contact members composed of layers of materials. The layers of the members are chosen to provide for reflow attach at both ends, and a non-reflowable core which retains its geometry so as to distribute the thermo-mechanical stresses away from the reflowed joints after assembly. Each member is solder-attached at one end to a chip contact pad, while the other end of each member is operable for reflow attachment to external parts.

The height-to-diameter ratio of the contact members is preferably >/=1 and the diameter of the non-reflowable core stays constant after reflow attachment. Preferably, the core of the members is made of a low modulus material; preferred choices include aluminum, copper, nickel, cobalt, titanium, tantalum, tungsten, tin, lead, and alloys thereof. The end surfaces of the core material may have an adherent layer of solderable metal, including copper, nickel, cobalt, gold, palladium, and alloys thereof. The members may have an additional layer of reflowable material at each end, preferably a tin alloy, or a conductive adhesive compound.

The member is to be stamped from a multi-layer sheet or strip. It is an advantage to manufacture the multi-layer sheet in strip or sheet form, as efficient processes like cladding or high-speed plating can be used. It is an advantage for many applications to select the reflowable material layers so that the material at the first end to be reflowed has a higher reflow temperature than the material intended for secondary attachment. The stamping process can be integrated with the placement of the members on to the chip or package contact pads.

Yet another embodiment of the invention comprises a semiconductor package, such as a ball grid array or a chip-scale package, which has a plurality of pads and contact members composed of layers of materials. The layers of the members are chosen to provide for reflow attach at both ends, and a non-reflowable core which retains its geometry so as to distribute the thermo-mechanical stresses away from the reflow joints after assembly. Each of these contact members is solder-attached at one end to a package contact pad, while the other end of each member is operable for reflow attachment to external parts.

The process flow for fabricating non-reflowable contact members and assembling these members on the integrated circuit pads of semiconductor wafers, or package pads of semiconductor devices, starts with providing a metal sheet, which has a core layer of non-reflowable metal and a layer of reflowable material on each surface. The thickness of the sheet is selected so that it will determine the height of the member-to-be-fabricated.

Further provided is a two-part die for guiding a stamping punch, each part having a structure to match the pattern of the IC pads, or package pads. The multi-layer sheet is clamped between the die parts. The stamping punch has a plurality of stamping pins with a diameter, which determines the diameter of the members-to-be-fabricated. The distribution of the pins matches the distribution of the contact pads.

The stamping punch, the die with the clamped sheet, and the semiconductor wafer (or package, respectively) are aligned so that each stamp pin is located over one of the contact pads. Pressing the punch through the die and the sheet stamps out a member of the sheet and creates one member for each pad area. After the members and the pads are brought into contact, heat is applied until the reflowable material between the members and the pads is melting. When the temperature is lowered again below the reflow temperature, each member becomes firmly attached to its respective contact pad.

It is a technical advantage of the method of the invention that the height-to-diameter ratio of the connection members is controlled by the choice of the metal sheet thickness and the stamping punch pin diameter. The distribution of the mechanical stress can thus be controlled.

Another advantage of the invention is the wide range of material variation available for the choice of the connection members, enabled by the selection of the non-reflowable metal sheet, its wettable surfaces, and its reflowable material layers.

The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

The schematic FIGS. 1 to 6 describe process steps for one embodiment of the invention, comprising the fabrication of interconnection elements of substantially uniform volume and the assembly of these interconnection elements on the integrated circuit (IC) contact pads of a semiconductor wafer, a singulated chip, or their assembly on the contact pads of a semiconductor package or a substrate such as a printed circuit board. One result of the inventive method is that all interconnection elements have substantially the same volume and the same height.

Figure 1:
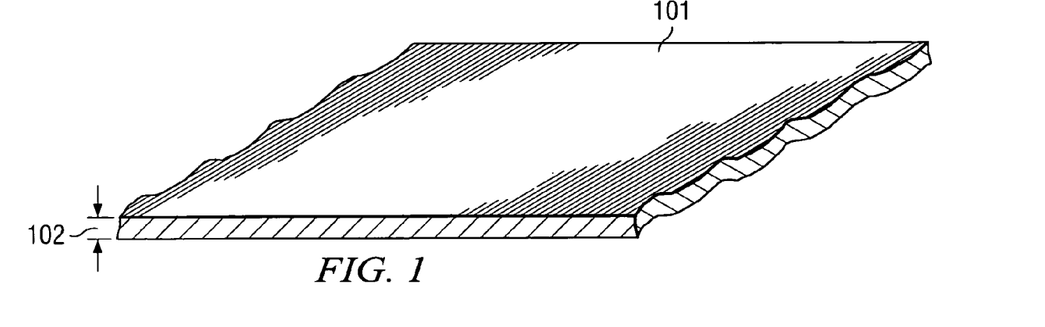
FIG. 1 is the perspective view of a sheet of solder material.

A first embodiment process flow starts with a sheet or ribbon of solder material 101, as depicted in FIG. 1. The solder material can be selected from a group consisting of tin, tin alloys including tin/copper, tin/indium, tin/silver, tin/bismuth, tin/lead, or indium; in other embodiments, the sheet may comprise conductive adhesive compounds or similar materials. The sheet or ribbon 101 has uniform thickness 102. Thickness 102 determines one dimension of the resulting interconnection elements.

Figure 2:
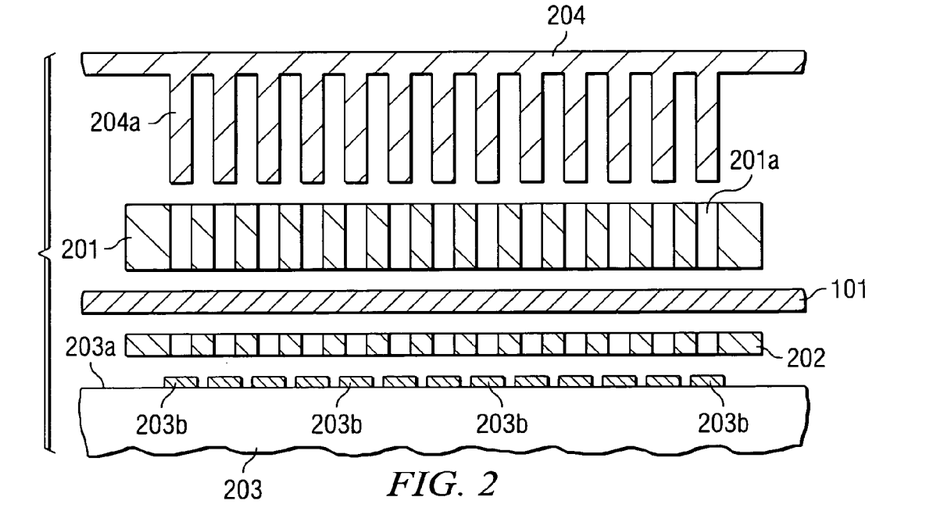
FIG. 2 is a schematic cross section of a plurality of separate parts for assembly according to the invention, comprising solder sheet, stamping punch, two-part die, and wafer (or package, or substrate).

Solder sheet 101 is positioned between the parts of a die, as shown in the exploded schematic cross section of FIG. 2. The die has first part 201 with a plurality of openings 201a designed to match the stamping punch 204 and operate as guides to the pins 204a of the stamping punch 204. The second part 202 of the die is adjacent the surface 203a of the workpiece 203 (primary forms of the workpiece include for example a wafer, semiconductor chip, package, and substrate). Sometimes, the first part 201 of the die is referred to as the "stripper", and the second part 202 as the "die" (in a narrow sense). On the surface 203a of the workpiece 203 are a plurality of the contact pads 203b, which have been prepared to accept the resulting interconnection elements. The preparation includes a solderable contact surface such as copper with a flash of gold or palladium.

The pattern of pins 204a is matched by the openings 201a of the die and the contact pads 203b of the workpiece 203. The cross sectional area of these pins (viewed along the length of the pin) contains the other two dimensions effective for determining the volume of the interconnection elements. The cross sectional shape of these stamping pins may be round, elliptical, square, rectangular, or any other suitable configuration.

Figure 3:
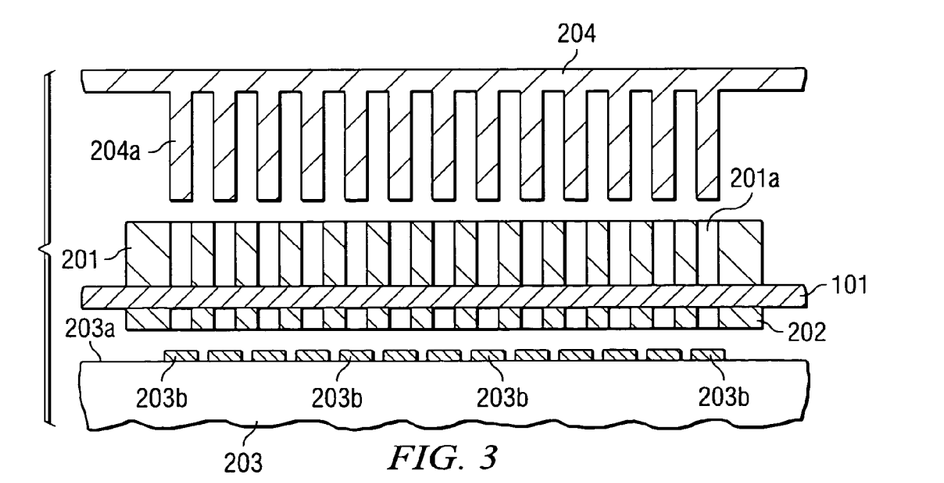
FIG. 3 is a schematic cross section of the same parts as in FIG. 2, with the solder sheet clamped between the two parts of the die.

Solder sheet 101 is clamped between first die part 201 and second die part 202, as shown in FIG. 3. Stamping punch 204 and the die parts 201 and 202 are aligned with one another, with the clamped sheet 101 in between the parts, and the workpiece 203 so that each stamping pin 204a is located over one of the contact pads 203b.

Figure 4:
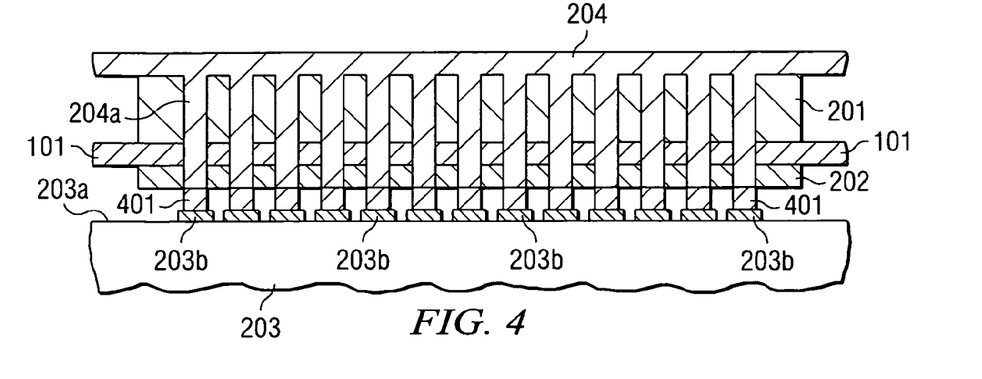
FIG. 4 is a schematic cross section of the same parts as in FIG. 2, with the solder platelets punched form the sheet by the stamping punch.

The stamping punch 204 is pressed through the die parts 201 and 202, and through solder sheet 101 so that each pin 204a punches a platelet 401 from sheet 101 (see FIG. 4). One platelet 401 is created for each contact pad area 203b on workpiece 203; consequently, no contact pad 203b is left without a solder platelet 401.

Figure 5:
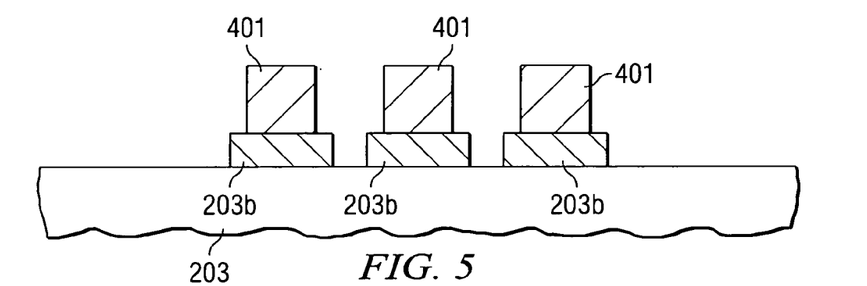
FIG. 5 is a schematic cross section of a portion of the wafer (or package, or substrate) after the solder platelets have been stamped from the sheet and attached to the contact pads.

FIG. 5 is a magnified cross sectional view of platelets 401 after they have been brought in surface contact with contact pads 203b. As can be seen, the stamping method creates solder platelets of substantially equal size and volume. The height is determined by the thickness 102 of the solder sheet 101, and the area is determined by the cross section of pins 204a, which, in turn, has been selected to be approximately equal to the area of contact pads 203b.

Figure 6:
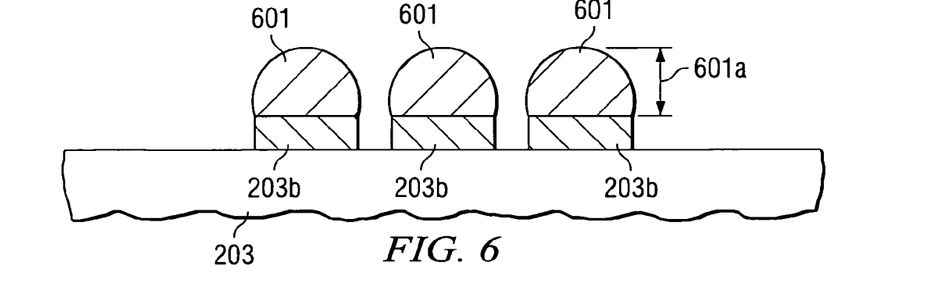
FIG. 6 is a schematic cross section of the same portion of the wafer (or package, or substrate) as in FIG. 5, after reflow of the solder platelets.

Solder flux may be applied to the contact pads 203b prior to aligning the die and solder sheet with the workpiece. Consequently, after applying heat to the individual solder platelets and the workpiece, the platelet melts and wets pad 203b. In FIG. 6, surface tension has formed "balls" 601 (more precisely "half-domes") out of the melted solder. All balls 601 have substantially the same solder volume, and they have substantially the same height 601a since they completely cover the equal area of contacts 203b.

The method of the invention allows the fabrication of interconnection elements over a wide range of solder ball sizes. As an example, when workpiece 203 is a silicon wafer and the pads 203b are the contact pads of an IC, typical solder ball heights are between 0.1 to 0.3 mm. The assembly is by flip-chip surface mount. As another example, when workpiece 203 is a semiconductor package, or a substrate, and the pads 203b are package contact pads, or substrate contact pads, respectively, typical solder ball heights are 0.5 mm and thus considerably more voluminous. The semiconductor packages may include ball grid array packages, chip-scale packages, chip-size packages, or any packages assembled to outside parts by means of surface mount and reflow materials.

Figure 7:
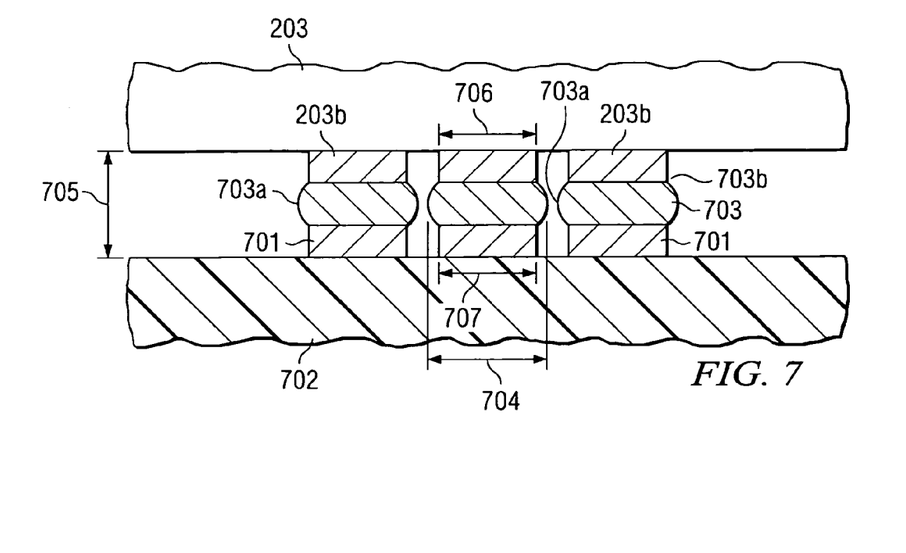
FIG. 7 is a schematic cross section of the solder joints after reflow attachment of the wafer (or package, or substrate) onto an external part.

The schematic cross section of FIG. 7 describes the typical result of surface mount assembly of a workpiece 203 onto the contact pads 701 of a substrate 702. The solder balls 601 of FIG. 6 are reflowed a second time; under pressure, they deform into the bulgy shape of the interconnections 703, characterized by the protruding center regions 703a and the comparatively narrower solder joints 703b.

The schematic FIGS. 8A and 8B to 12 describe the process steps for other embodiments of the invention, comprising the fabrication of composite contact members, which are partly reflowable and partly non-reflowable, and the subsequent assembly of these members on the IC contact pads of a semiconductor wafer, or respectively, their assembly on the contact pads of a semiconductor package or a substrate such as a printed circuit board.

Figure 8A:
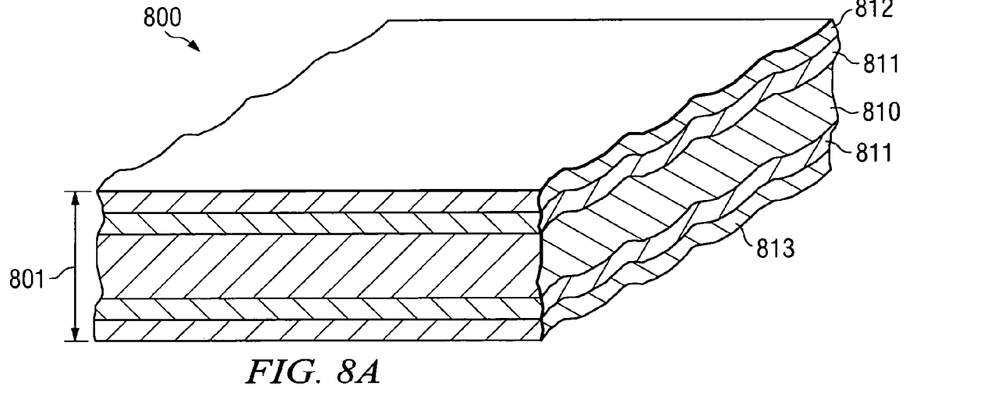
FIG. 8A is the perspective view of a composite sheet of attachment material according to the invention.

The process flow starts with the layered sheet or ribbon generally designated 800 in FIG. 8A. The sheet has uniform thickness 801. Thickness 801 determines the height of the interconnection members-to-be-fabricated.

Figure 8B:
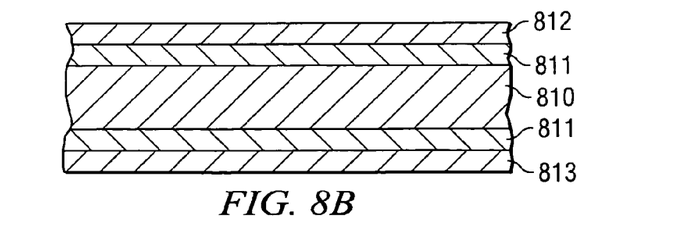
FIG. 8B is a schematic cross section through the composite sheet of attachment material according to the invention.

The cross section of FIG. 8B describes the layered structure of sheet 800. The composition and fabrication of sheet 800 insures low cost. The relatively thick core layer 810 is made of non-reflowable metal, preferably of low modulus material, selected from a group consisting of aluminum, copper, nickel, cobalt, titanium, tantalum, tungsten, tin, lead and alloys thereof (tin and lead are only used in the temperature range below their reflow temperature). A preferred low cost choice is aluminum. When the metal of layer 810 is not solderable, an additional adherent layer 811 of solderable material is on both surfaces of the core layer 810. Preferably, the additional metal is selected from a group consisting of copper, nickel, cobalt, gold, silver, palladium, and alloys thereof. Compared to the thick core layer 810, the solderable layer 811 may be thin.

The outermost surfaces of sheet 800 are adherent layers of reflowable material. The reflowable materials are selected from a group consisting of tin, tin alloys including tin/copper, tin/indium, tin/silder, tin/bismuth, tin/lead, or indium. In the preferred embodiment, the reflowable layer 812, which will be used for the first interconnect, has a higher reflow temperature than the reflowable layer 813, which will be used for the second interconnect.

Figure 9:
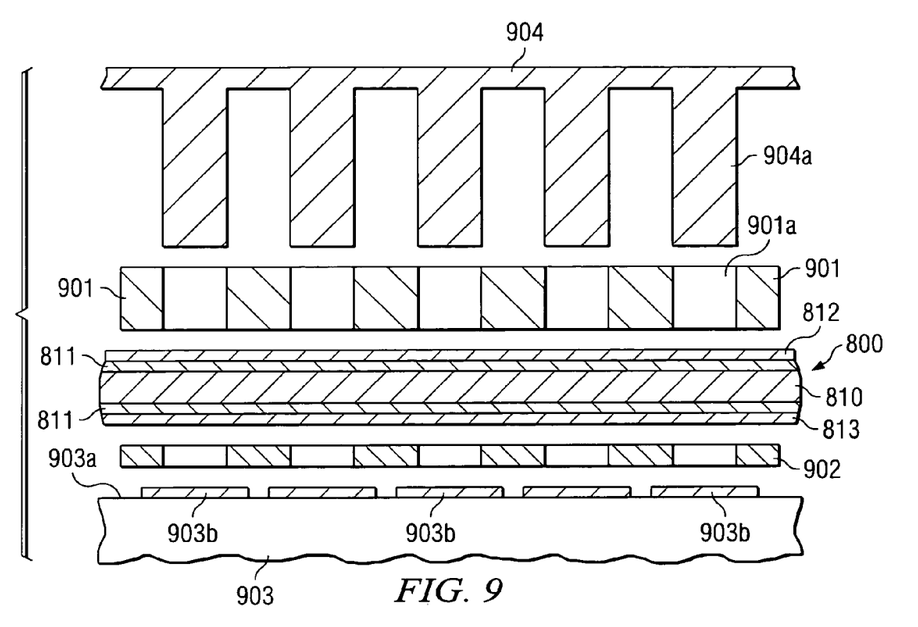
FIG. 9 is a schematic cross section of a plurality of separate parts for assembly according to the invention, comprising composite sheet, stamping punch, two-part die, and wafer (or package, or substrate).

As shown in FIG. 9, sheet 800 is positioned between a die having a first part 901 with a plurality of openings 901*a* designed to match the stamping punch and operate as guides to the pins of the stamping punch. The second part of the die is designated 902; it faces the surface 903*a* of the workpiece 903. Examples of workpieces include a semiconductor wafer, a device package, and a substrate such as a printed circuit board. On the surface 903*a* of workpiece 903 are the plurality of contact pads 903*b*, which are made of solderable metal and have been prepared to accept the connection members-to-be-formed. To improve solderability, the preparation may include the deposition of flux.

Also shown in FIG. 9 is the schematic cross section of the stamping punch 904 with the plurality of stamping pins 904*a*. The pattern of pins 904*a* is matched by the openings 901*a* of the die and the contact pads 903*b* of the workpiece 903. The diameter of these pins determines the diameter of the members-to-be-fabricated. The stamping pins have cross sections selected to include a circle, an ellipse, a square and a rectangle; the pins may also have cross section of other suitable configurations.

Figure 10:
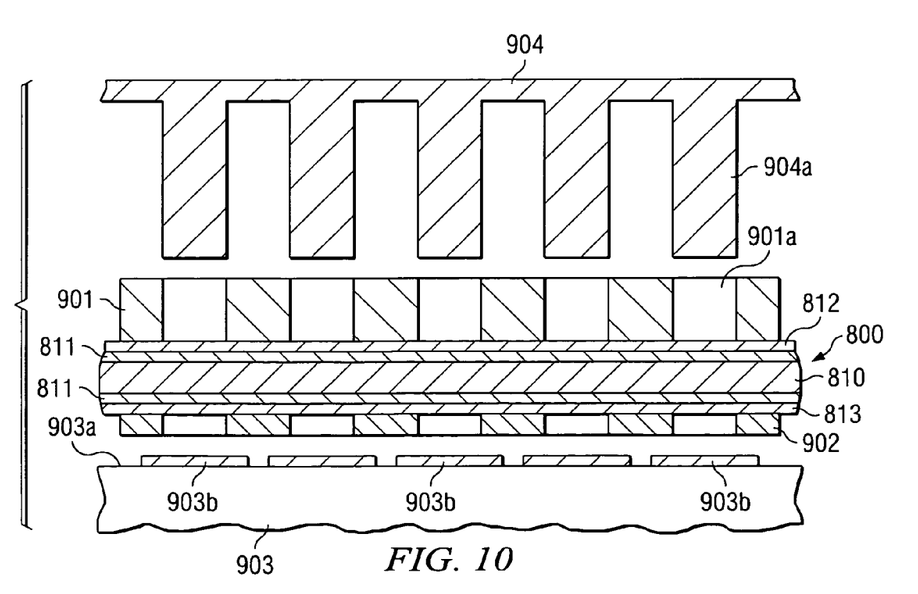
FIG. 10 is a schematic cross section of the same parts as in FIG. 9, with the composite sheet clamped between the two parts of the die.

FIG. 10 illustrates the process step of clamping the sheet 800 between first die part 901 and second die part 902. Further shown in FIG. 10 is the process step of aligning the stamping punch 904, the die parts 901 and 902 with the clamped sheet 800 in between the parts, and the workpiece 903 so that each stamp pin 904*a* is located over one of the contact pads 903*b*.

Figure 11:
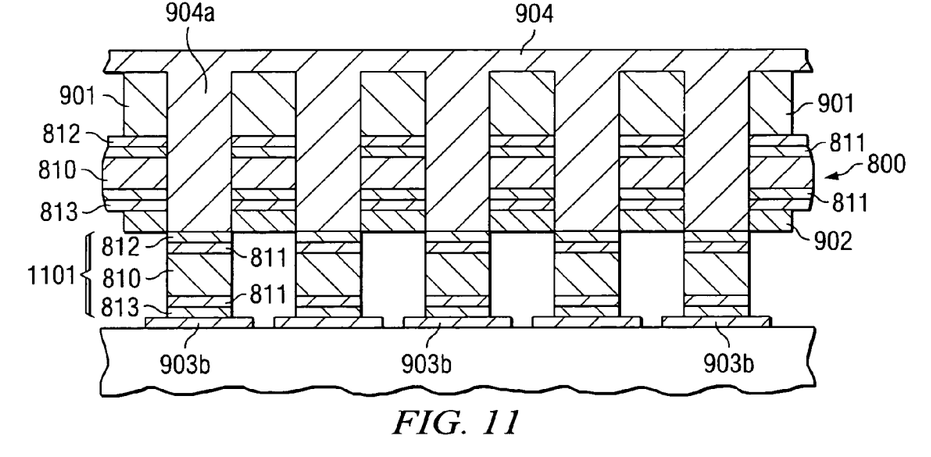
FIG. 11 is a schematic cross section of the same parts as in FIG. 9, with the composite columns punched from the sheet by the stamping punch.

In the next process step, depicted in FIG. 11, the stamping punch 904 is pressed through the die parts 901 and 902, and through sheet 800 so that each stamping pin 904*a* punches a member 1101 from sheet 800. In this process step, one member 1101 is created for each contact pad area 903*b* on workpiece 903. No contact pads 903*b* are left without a connection member 1101.

Figure 12:
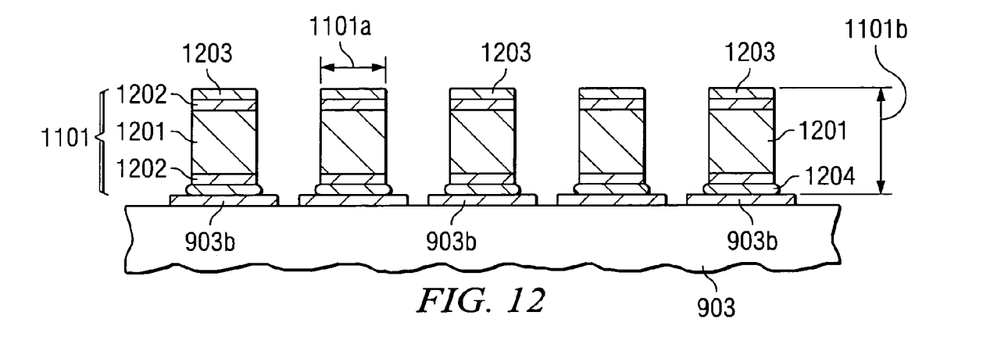
FIG. 12 is a schematic cross section of a portion of the wafer (or package, or substrate) after the composite columns have been stamped from the sheet and attached to the contact pads.

In a magnified cross sectional view, FIG. 12 illustrates a small number of these connection members 1101 after they have been brought in surface contact with contact pads 903*b*. As can be seen, the stamping method creates members of equal height 1101*b*, each member having uniform diameter over the complete height. The diameter 1101*a* is the diameter of the punching pin. For absorbing strain under thermomechanical stress, the preferred height-to-diameter ratio is >/=1. The height 1101*b* is determined by the thickness 801 of the sheet 800, and the diameter 1101*a* is determined by the diameter of stamping pin 904*a*. The core portion 1201 of members 1101 is a non-reflowable material determined by the selection of the core layer 810 of sheet 800; preferred examples include aluminum or copper. The solderable surface on each end of the members may have to be created by an adherent layer 1202 of solderable metal (for example copper or gold), if the non-reflowable metal 1201 is not solderable by nature. Layers 1203 and 1204 are made of reflowable material. Preferably, the material selected for layer 1204 has a higher reflow temperature than the material selected for layer 1203. In FIG. 12, layers 1204 have already reflowed in order to attach members 1101 to contact pads 903*b* of workpiece 903. Layers 1203 have reflowed and solidified and are still operable for reflow attachment to external parts at a lower reflow temperature.

Solder flux may be applied to the contact pads 903*b* prior to aligning the die and sheet with the workpiece. Consequently, after applying heat to the individual connection members and the workpiece, the layers 1203 and 1204 will melt, layer 1204 wetting the whole area of contact pad 903*b*. This reflow process step is indicated in FIG. 12 by the bulging perimeter contours of layers 1204 and the radius of the corners of 1203.

Figure 13:
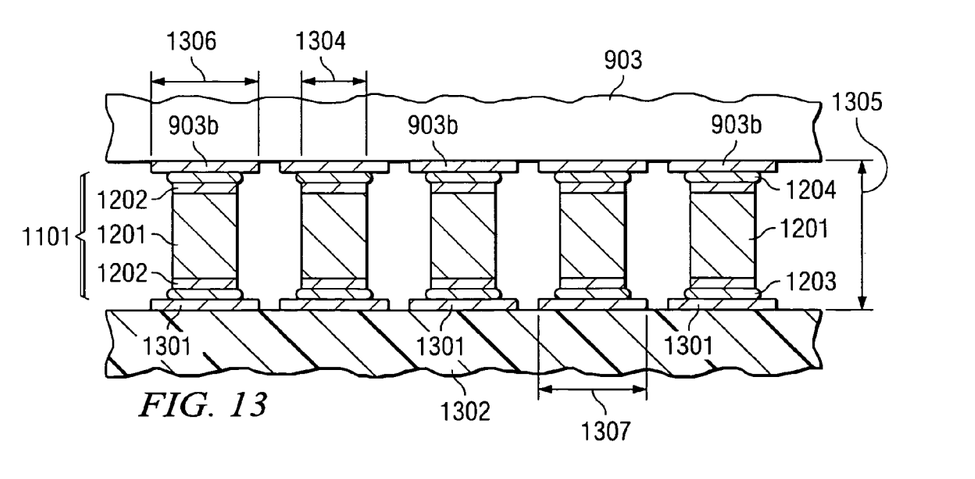
FIG. 13 is a schematic cross section of the interconnections using the composite columns after reflow attachment of the wafer (or package, or substrate) onto an external part.

The schematic cross section of FIG. 13 describes the typical result of a flip-chip surface mount assembly of a chip or package 903 onto the contact pads 1301 of a substrate 1302. The assembly is heated to the reflow temperature of layer 1203 so that the reflowable material of layer 1203 is melting. Under the slight pressure of assembly, layers 1203 deform into the somewhat bulgy perimeter indicated in FIG. 13. In contrast to the solder layers 1203, the non-reflowable columns 1201 of the members remain unchanged by the assembly temperature: cylinders or cubes of uniform diameter (dependent on the cylinder or cube cross section) and uniform height, positioned vertically relative to the plane of the substrate pads 1301.

Referring now to FIG. 7, in a mass-produced device by way of example, the standoff 705 is 180 μm, while bulge 703*a* has a diameter 704 of 270 μm. In this device, the contact pad 203*b* (made of copper) of the device has a diameter 706 of 140 μm, the contact pad 701 (made of copper) of the board has a diameter 707 of 175 μm. The board 702 typically has a higher coefficient of thermal expansion than the device 203. Consequently, stress is created at the solder joint during temperature cycling, as it is experienced during reliability testing from −40 to +150° C. or in device operation. For the geometries involved, a calculation of the moment of inertia shows an estimated 260E6 μmE4.

This value is to be compared to the same device having the column-shaped members of FIG. 13. The standoff 1305 is 180 μm, while the diameter 1304 of the connection column is 140 μm throughout the length of the column. The contact pad 903*b* of the device has a diameter 1306 of 140 μm, the contact pad 1301 of the board has a diameter 1307 of 175 μm. The board 1302 typically has a higher coefficient of thermal expansion than the device 903. Consequently, stress is created at the solder joint during temperature cycling, as it is experienced during reliability testing from −40 to +150° C. or in device operation. For the geometries involved, a calculation of the moment of inertia shows an estimated 18 to 19E6 μmE4. This value is a 13× improvement over the value calculated for the assembly in FIG. 7. Even with a 30% increase in Young's moduli (relative to solder) and the same displacement, this improvement translates into a reduced stress by at least a factor of 10.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the concept of punching, on the location of usage, a plurality of non-reflowable interconnections of equal height from a sheet of starting material and then affixing these interconnections in the assembly of one part with another part, can be applied to a wide range of products. These products can especially be found in, but are not limited to, electronics boards composed of a variety of different components. It is therefore intended that the appended claims encompass any such modifications or embodiments.

We claim:

1. A method for forming connection members and assembling said members on the contact pads on a semiconductor device comprising the steps of:
   providing a metal sheet with a top surface and a bottom, having a core layer of a non-reflowable metal and a layer of reflowable material adherent to each surface, the thickness of said sheet determining the height of said connection members;
   providing a two-part die for guiding a stamping punch, each part having a structure to match the pattern of said contact pads;
   positioning and clamping said sheet between said die parts;
   providing a stamping punch having a plurality of stamping pins, the diameter of said pins determining the diameter of said connection members, said pins distributed to match said contact pad distribution;
   aligning said punch, said die having said sheet clamped between said parts and said semiconductor device so that each stamp pin is located over one of said contact pads;
   pressing said punch through said die and said sheet so that each stamping pin punches a connection member from said sheet, creating one connection member for each contact pad;
   bringing said members in surface contact with said pads;
   applying heat to said individual members and said device to melt said reflowable material between said members and said pads; and
   cooling the temperature below the reflow temperature whereby each member becomes firmly attached to its respective pad.

2. The method according to claim 1 wherein solder flux is applied to said contact pads prior to aligning said die and sheet with said wafer.

3. The method according to claim 1 wherein said members are positioned vertically relative to the plane of said pads.

4. The method according to claim 1 wherein all said connection members are of substantially the same size.

5. The method according to claim 1 wherein said stamping pins are shaped as cylinders having a cross section selected from a group consisting of round, elliptical, square, and rectangular.

* * * * *